(12) United States Patent
Lee et al.

(10) Patent No.: US 10,420,227 B2
(45) Date of Patent: Sep. 17, 2019

(54) ELECTRONIC APPARATUS HAVING FLEXIBLE DISPLAY DEVICE

(71) Applicant: Samsung Electronics Co., Ltd., Suwon-si, Gyeonggi-do (KR)

(72) Inventors: Hyung-sun Lee, Yongin-si (KR); Yu-su Kim, Yongin-si (KR); Toshikazu Takayanagi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/747,584

(22) PCT Filed: Apr. 5, 2016

(86) PCT No.: PCT/KR2016/003501
§ 371 (c)(1),
(2) Date: Jan. 25, 2018

(87) PCT Pub. No.: WO2017/022926
PCT Pub. Date: Feb. 9, 2017

(65) Prior Publication Data
US 2018/0376603 A1    Dec. 27, 2018

(30) Foreign Application Priority Data
Aug. 5, 2015  (KR) .................. 10-2015-0110659

(51) Int. Cl.
| H05K 7/02 | (2006.01) |
| H05K 7/04 | (2006.01) |
| H05K 5/00 | (2006.01) |
| G06F 1/16 | (2006.01) |
| H05K 5/02 | (2006.01) |
| H04M 1/02 | (2006.01) |
| G09F 9/30 | (2006.01) |

(52) U.S. Cl.
CPC ......... *H05K 5/0017* (2013.01); *G06F 1/1652* (2013.01); *H04M 1/0268* (2013.01); *H05K 5/0217* (2013.01); *H05K 5/0221* (2013.01); *G09F 9/301* (2013.01)

(58) Field of Classification Search
USPC ....................................................... 361/809
See application file for complete search history.

(56) References Cited

U.S. PATENT DOCUMENTS 8,379,377 B2    2/2013  Walters et al.
8,516,728 B2    8/2013  Jung
(Continued)

FOREIGN PATENT DOCUMENTS

EP    2 538 400 A1    12/2012
EP    1 565 900 B1    4/2013
(Continued)

*Primary Examiner* — Hung S. Bui
(74) *Attorney, Agent, or Firm* — Jefferson IP Law, LLP

(57) ABSTRACT

A disclosed electronic device includes a housing having an opening, a roll mounted in the housing, a flexible display wound on the roll and being extendable and retractable through the opening based on a rotation direction of the roll, and a roll guide configured to guide the roll to move in a direction capable of constantly maintaining a proceeding direction of the flexible display toward the opening in the housing, based on a variation in a wound length of the flexible display on the roll.

15 Claims, 13 Drawing Sheets

(56) References Cited

U.S. PATENT DOCUMENTS

| | | | |
|---|---|---|---|
| 8,654,519 B2 | 2/2014 | Visser et al. | |
| 8,773,411 B2 | 7/2014 | Van Lieshout et al. | |
| 9,019,313 B2 | 4/2015 | Kwack et al. | |
| 9,743,537 B2 * | 8/2017 | Kim | G06F 1/1652 |
| 9,756,757 B2 * | 9/2017 | Park | G09F 9/301 |
| 2007/0241002 A1 | 10/2007 | Wu et al. | |
| 2012/0204453 A1 | 8/2012 | Jung | |
| 2014/0048576 A1 | 2/2014 | Tan | |
| 2014/0194165 A1 | 7/2014 | Hwang | |
| 2015/0029229 A1 | 1/2015 | Voutsas | |
| 2015/0316962 A1 * | 11/2015 | Howes | G03B 21/58 16/87.2 |
| 2016/0139633 A1 * | 5/2016 | Lee | G06F 1/1652 345/33 |
| 2016/0187929 A1 * | 6/2016 | Kim | G06F 1/1652 345/184 |
| 2017/0023978 A1 * | 1/2017 | Cho | H04M 1/0268 |

FOREIGN PATENT DOCUMENTS

| | | |
|---|---|---|
| EP | 2 538 400 B1 | 3/2014 |
| EP | 3 121 680 A1 | 1/2017 |
| KR | 10-2012-0093665 A | 8/2012 |
| KR | 10-2013-0055259 A | 5/2013 |

* cited by examiner

ELECTRONIC APPARATUS HAVING FLEXIBLE DISPLAY DEVICE

TECHNICAL FIELD

The present disclosure relates to electronic devices, and more particularly, to structures in which flexible displays are extendable out of or retractable into electronic devices.

BACKGROUND ART

Currently, display devices are regarded as essential electronic products. Electronic devices are required to be of compact size but many customers also desire large screens. Therefore, research and development are being actively conducted on flexible displays which are foldable or rollable into electronic devices.

DETAILED DESCRIPTION OF THE INVENTION

Technical Problem

Provided are electronic devices capable of minimizing damage to flexible displays when the flexible displays extend out of or retract into the electronic devices.

Technical Solution

According to an aspect of an embodiment, an electronic device includes a housing having an opening, a roll mounted in the housing, a flexible display wound on the roll and being extendable and retractable through the opening based on a rotation direction of the roll, and a roll guide configured to guide the roll to move in a direction capable of maintaining a proceeding direction of the flexible display toward the opening in the housing, based on a variation in a wound length of the flexible display on the roll.

The electronic device may further include a central shaft serving as an axis of rotation of the roll, and the roll guide may guide the central shaft.

The electronic device may further include a winding member configured to provide elastic force in a direction capable of winding the flexible display on the roll.

The electronic device may further include a locking unit configured to lock the roll so as not to rotate in a direction of the elastic force of the winding member.

The locking unit may include a stopper projection provided on the roll, and a stopper lever having a release location where interference with the stopper projection is released, and a contact location where the stopper lever is obstructed by the stopper projection to stop rotation of the roll.

The roll guide may guide the roll to move in a direction perpendicular to the proceeding direction of the flexible display toward the opening in the housing.

The roll guide may guide the roll to move diagonally to a direction perpendicular to the proceeding direction of the flexible display toward the opening.

The electronic device may further include a display guide having a supporting surface configured to support the flexible display and guide the flexible display unwound from the roll, toward the opening.

The electronic device may further include a guide member configured to guide the flexible display at a side opposite to the display guide with respect to the flexible display interposed between the guide member and the display guide.

The guide member may guide the flexible display to proceed in a horizontal direction after passing through the opening.

The electronic device may further include a push member configured to push the roll toward the display guide in such a manner that the flexible display wound on the roll contacts the supporting surface.

The electronic device may further include an elastic member configured to provide elastic force to push the push member toward the display guide.

The push member may include a roller rotating in contact with the flexible display.

The push member may include a roll spring supported by the roll guide and pushing the roll toward the display guide.

The electronic device may further include a pinion gear rotating together with the roll, and a rack gear connected to the pinion gear and extending in an extension direction of the roll guide.

The electronic device may further include one or more reduction gears interposed between the pinion gear and the rack gear.

According to another aspect of an embodiment, an electronic device includes a housing having an opening, a roll mounted in the housing, and a flexible display having an end connected to the roll, wound on the roll, and being extendable and retractable through the opening based on a rotation direction of the roll, wherein the roll moves to constantly maintain a proceeding angle of the flexible display toward the opening in the housing.

The electronic device may further include a central shaft serving as an axis of rotation of the roll, and a roll guide configured to guide the central shaft in a direction capable of constantly maintaining the proceeding angle.

The roll guide may guide the roll to move in a direction perpendicular to a proceeding direction of the flexible display toward the opening in the housing.

The roll guide may guide the roll to move diagonally to a direction perpendicular to a proceeding direction of the flexible display toward the opening.

According to another aspect of an embodiment, an electronic device includes a housing having an opening, a roll mounted in the housing, a flexible display wound on the roll and being extendable and retractable through the opening based on a rotation direction of the roll, a supporting surface configured to support the flexible display wound on the roll, and a roll guide configured to guide the roll to move toward the supporting surface as the flexible display is unwound from the roll.

The supporting surface may extend toward the opening to guide the flexible display unwound from the roll, toward the opening.

The electronic device may further include a push member configured to push the roll toward the supporting surface.

The electronic device may further include an elastic member configured to provide elastic force to push the push member toward the supporting surface.

The push member may include a roller rotating in contact with the flexible display wound on the roll.

The electronic device may further include a guide member configured to guide the flexible display toward the opening at a side opposite to the supporting surface.

The electronic device may further include a pinion gear rotating together with the roll, and a rack gear connected to the pinion gear and extending in an extension direction of the roll guide.

The electronic device may further include one or more reduction gears interposed between the pinion gear and the rack gear.

Advantageous Effects of the Invention

According to an embodiment, when a flexible display extends out of an electronic device, a roll having the flexible display wound thereon may move to reduce a load applied to the flexible display.

MODE OF THE INVENTION

Figure 1:
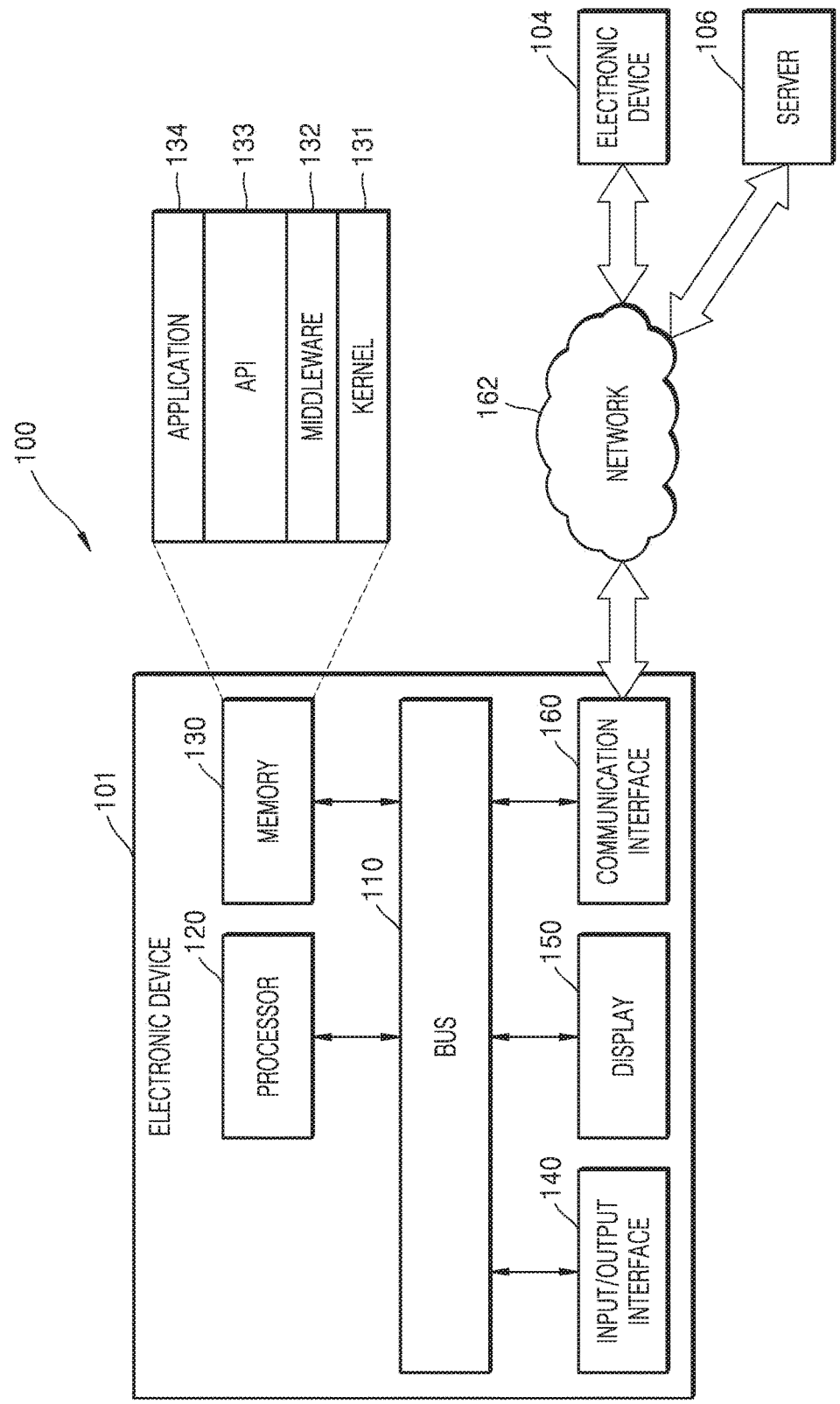
FIG. 1 is a block diagram of a network environment including an electronic device according to an embodiment.

Hereinafter, various embodiments of the present disclosure are described in detail with reference to the accompanying drawings. However, this description is not intended to limit the present disclosure to the described embodiments and it should be understood that the present disclosure covers all modifications, equivalents, and/or alternatives thereof. In the drawings, like reference numerals denotes like elements.

As used herein, terms such as "have", "may have", "include", "may include", "comprise", and "may comprise" specify the presence of stated features (e.g., values, functions, operations, or elements), but do not preclude the presence or addition of one or more other features.

The expressions "A or B", "at least one of A or/and B", or "one or more of A or/and B" used herein include any and all combinations of one or more of the listed items. For example, "A or B", "at least one of A and B", or "at least one of A or B" means (1) including at least one A, (2) including at least one B, or (3) including both at least one A and at least one B.

Terms such as "1st", "2nd", "first", and "second" may be used herein to describe various elements regardless of order and/or priority thereof, but these elements should not be limited by these terms. These terms are only used to distinguish one element from another. For example, "a first user device" and "a second user device" may indicate different user devices regardless of order and/or priority thereof. For example, a first element could be termed a second element and, similarly, a second element could be termed a first element without departing from the scope of the present disclosure.

It will be understood that when an element (e.g., first element) is referred to as being "(operatively or communicatively) coupled with/to" or "connected to" another element (e.g., second element), the element can be directly coupled or connected to the other element or an intervening element (e.g., third element) may be present. Conversely, when an element (e.g., first element) is referred to as being "directly coupled" or "directly connected" to another element (e.g., second element), there is no intervening element (e.g., third element) present.

The expression "configured to" may be interchangeably used with "suitable for", "having the capacity to", "designed to", "adapted to", "made to", or "capable of" according to the context. The expression "configured to" does not necessarily mean "specifically designed to" in terms of hardware. Instead, the expression "a device configured to . . . " may mean that the device is "capable of . . . " along with other devices or parts in a certain situation. For example, "a processor configured to perform A, B, and C" may mean a dedicated processor (e.g., an embedded processor) for performing the operations or a generic-purpose processor (e.g., a central processing unit (CPU) or application processor) for performing the operations by executing at least one software program stored in a memory device.

Terms used herein are used merely to describe certain embodiments and do not limit the scope of the present disclosure. Singular forms may include plural forms as well unless the context explicitly indicates otherwise. Unless defined differently, all terms used in the description including technical and scientific terms have the same meaning as generally understood by one of ordinary skill in the art. Terms as defined in a commonly used dictionary should be construed as having the same meaning as in an associated technical context, and unless defined in the description, the terms are not ideally or excessively construed as having formal meaning. In any case, even the terms defined in this specification cannot be interpreted as excluding embodiments of the present disclosure.

Electronic devices described herein according to various embodiments may include at least one of, for example, smartphones, tablet personal computers (PCs), mobile phones, video phones, electronic book (e-book) readers, desktop PCs, laptop PCs, netbook computers, workstations, servers, personal digital assistants (PDAs), portable multimedia player (PMI's), MP3 players, mobile medical devices, cameras, and wearable devices. According to various embodiments, the wearable devices may include at least one of accessory type wearable devices (e.g., watches, rings, bracelets, ankle bracelets, necklaces, glasses, and head-mounted-devices (HMDs)), textile/clothing type wearable devices (e.g., electronic apparel), body-attached wearable devices (e.g., skin pads and tattoos), and body-implantable wearable devices (e.g., implantable circuits).

In some embodiments, the electronic devices may be home appliances. The home appliances may include at least one of, for example, televisions (TVs), digital versatile disc (DVD) players, audio players, refrigerators, air conditioners, cleaners, washing machines, air cleaners, set-top boxes, home automation control panels, security control panels, TV boxes (e.g., Samsung HomeSync™, Apple TV™, and Google TV™), game consoles (e.g., Xbox™ and PlayStation™), electronic dictionaries, electronic keys, camcorders, and electronic picture frames.

In other embodiments, the electronic devices may include at least one of various medical devices (e.g., various portable medical measurement devices such as blood glucose meters, heart rate meters, blood pressure meters, and thermometers, magnetic resonance angiography (MRA) devices, magnetic resonance imaging (MRI) devices, computed tomography (CT) devices, scanners, and ultrasonic devices), navigation devices, global navigation satellite systems (GNSSs), event data recorders (EDRs), flight data recorders (FDRs), vehicle infotainment devices, electronic equipment for vessels (e.g., vessel navigation systems and gyrocompasses), avionics, security devices, vehicle head units, industrial or home robots, automatic teller machines (ATMs), point of sales (POS) devices, and Internet of Things (IoT) devices (e.g., lamps, various sensors, electricity or gas meters, sprinklers, fire alarms, thermostats, streetlamps, toasters, exercise equipment, hot water tanks, heaters, and boilers).

According to an embodiment, the electronic devices may include at least one of parts of furniture or buildings/structures, electronic boards, electronic signature receiving devices, projectors, or various measuring instruments (e.g., water meters, electricity meters, gas meters, and radio wave meters). In various embodiments, the electronic device may be one or a combination of two or more of the above-mentioned devices. The electronic device according to an embodiment may be a flexible electronic device. However, the electronic devices according to embodiments are not limited to the above-mentioned devices, but may include new electronic devices to be developed.

FIG. 1 is a block diagram of a network environment 100 including an electronic device 101 according to various embodiments.

Referring to FIG. 1, the electronic device 101 may include a bus 110, a processor 120, a memory 130, an input/output interface 140, and a display 150.

The bus 110 may be a circuit for interconnecting the above-mentioned elements and transmitting communication data (e.g., control messages) between the above-mentioned elements.

The processor 120 may, e.g., receive instructions from the above-mentioned other elements (e.g., the memory 130, the input/output interface 140, the display 150, and a communication interface 160) through the bus 110, interpret the received instructions, and perform calculation or data processing based on the interpreted instructions.

The memory 130 may store instructions or data received from the processor 120 or the other elements (e.g., the input/output interface 140, the display 150, and the communication interface 160) or generated by the processor 120 or the other elements. The memory 130 may include programming modules, e.g., a kernel 131, middleware 132, an application programming interface (API) 133, and applications 134. Each of the above-mentioned programming modules may be configured as software, firmware, hardware, or a combination of two or more thereof.

The kernel 131 may control or manage system resources (e.g., the bus 110, the processor 120, or the memory 130) which are used to perform operations or functions implemented in the other programming modules, e.g., the middleware 132, the API 133, or the applications 134. In addition, the kernel 131 may provide an interface for allowing the middleware 132, the API 133, or the applications 134 to access and control or manage each element of the electronic device 101.

The middleware 132 may serve as a relay for allowing the API 133 or the applications 134 to communicate and exchange data with the kernel 131. In addition, the middleware 132 may control (e.g., schedule or load-balance) operation requests received from the applications 134 by, for example, giving a priority of using the system resources (e.g., the bus 110, the processor 120, or the memory 130) of the electronic device 101 to at least one of the applications 134.

The API 133 may be an interface for allowing the applications 134 to control a function provided by the kernel 131 or the middleware 132, and may include at least one interface or function (e.g., an instruction) for, for example, file control, window control, image processing, or text control.

According to various embodiments, the applications 134 may include a short message service (SMS)/multimedia message service (MMS) application, an e-mail application, a calendar application, an alarm application, a healthcare application (e.g., an application for measuring a workrate or a blood glucose level), and an environmental information application (e.g., an application for providing information about atmospheric pressure, humidity, or temperature). Additionally or alternatively, the applications 134 may be applications related to information exchange between the electronic device 101 and an external electronic device (e.g., an electronic device 104).

The application related to information exchange may include, for example, a notification relay application for transmitting certain information to the external electronic device or a device management application for managing the external electronic device.

For example, the notification relay application may include a function for transmitting notification information generated from the other application of the electronic device 101 (e.g., the SMS/MMS application, the e-mail application, the health management application, or the environmental information application), to the external electronic device (e.g., the electronic device 104). Additionally or alternatively, the notification relay application may receive notification information from, for example, the external electronic device (e.g., the electronic device 104) and provide the received notification information to a user. The device management application may manage (e.g., install, delete, or update), for example, functions related to at least a part of the external electronic device (e.g., the electronic device 104) communicating with the electronic device 101 (e.g., functions for turning on/off the external electronic device (or some parts thereof) or adjusting brightness (or resolution) of a display), and applications operating in the external electronic device or services provided by the external electronic device (e.g., a call service or a message service).

According to various embodiments, the applications 134 may include an application that is designated based on properties (e.g., the type) of the external electronic device (e.g., the electronic device 104). For example, when the external electronic device is an MP3 player, the applications 134 may include an application related to reproduction of music. Similarly, when the external electronic device is a mobile medical device, the applications 134 may include an application related to healthcare. According to an embodiment, the applications 134 may include at least one of an application designated for the electronic device 101 and an application received from an external electronic device (e.g., a server 106 or the electronic device 104).

The input/output interface 140 may transmit an instruction or data input from the user through an input/output device (e.g., a sensor, a keyboard, or a touchscreen) to the processor 120, the memory 130, or the communication interface 160 through, for example, the bus 110. For example, the input/output interface 140 may provide, to the processor 120, data about the user's touch input through the touchscreen. In addition, the input/output interface 140 may output, through an input/output device (e.g., a speaker or a display), an instruction or data received from the processor 120, the memory 130, or the communication interface 160 through, for example, the bus 110. For example, the input/output interface 140 may output voice data processed by the processor 120, to the user through the speaker.

The display 150 may display various types of information (e.g., multimedia data and text data) to the user. The display 150 may include, for example, a liquid crystal display (LCD), a light-emitting diode (LED) display, an organic light-emitting diode (OLED) display, a microelectromechanical system (MEMS) display, an electronic paper display, or a flexible display. The display 150 may, for example, display various contents (e.g., text, images, videos, icons, and symbols) to the user. The display 150 may include a touchscreen and may receive, for example, touches, gestures, proximity touches, or hovering inputs using an electronic pen or a body part of the user.

The electronic device 101 may further include the communication interface 160. The communication interface 160 may establish a communication connection between the electronic device 101 and the external device (e.g., the electronic device 104 or the server 106). For example, the communication interface 160 may be connected to a network 162 through wireless or wired communication to communicate with the external device. The wireless communication technology may include at least one of, for example, wireless fidelity (Wi-Fi), Bluetooth (BT), near field communication (NFC), global positioning system (GPS), and cellular communication (e.g., long term evolution (LTE), LTE-advanced (LTE-A), code division multiple access (CDMA), wideband CDMA (WCDMA), universal mobile telecommunication system (UMTS), wireless-broadband (WiBro), and global system for mobile communications (GSM)). The wired communication technology may include at least one of, for example, universal serial bus (USB), high definition multimedia interface (HDMI), recommended standard 232 (RS-232), and plain old telephone service (POTS).

According to an embodiment, the network 162 may be a telecommunications network. The telecommunications network may include at least one of a computer network, the Internet, the Internet of things, or a telephone network. According to an embodiment, a protocol (e.g., a transport layer protocol, a data link layer protocol, or a physical layer protocol) for communication between the electronic device 101 and the external device may be supported by at least one of the applications 134, the API 133, the middleware 132, the kernel 131, and the communication interface 160.

Figure 2:
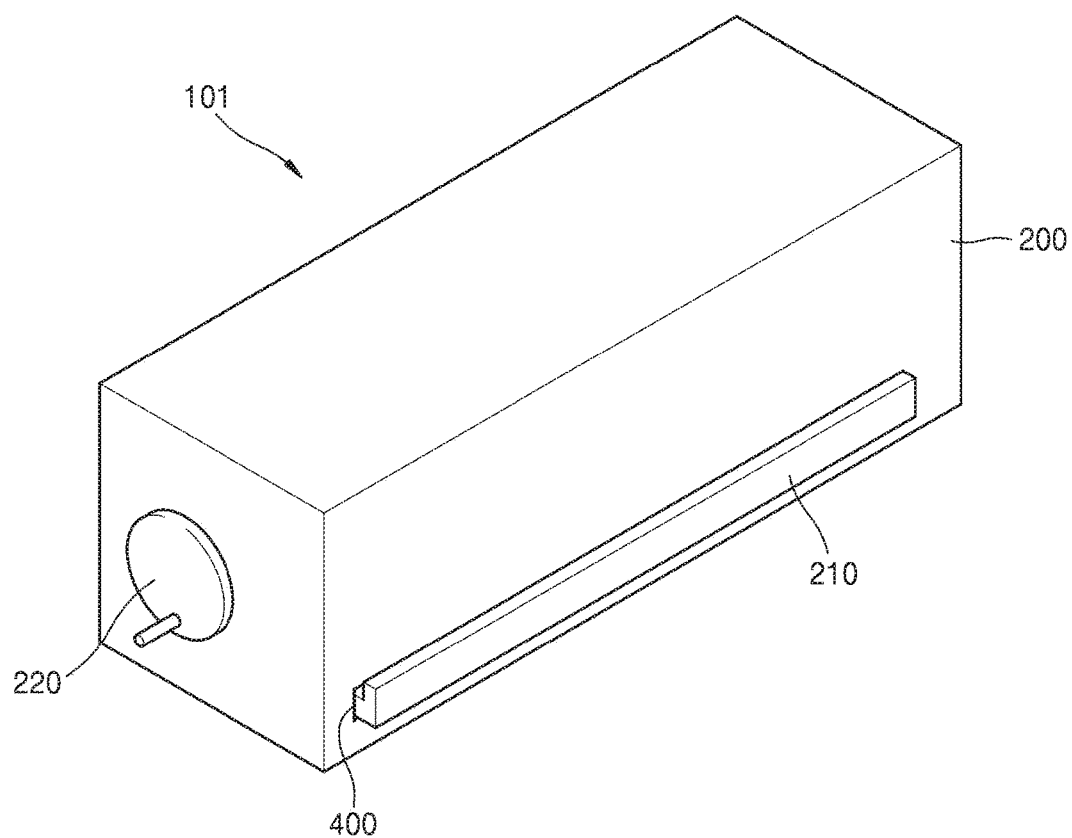
FIG. 2 is a perspective view of an electronic device according to an embodiment.
Figure 3:
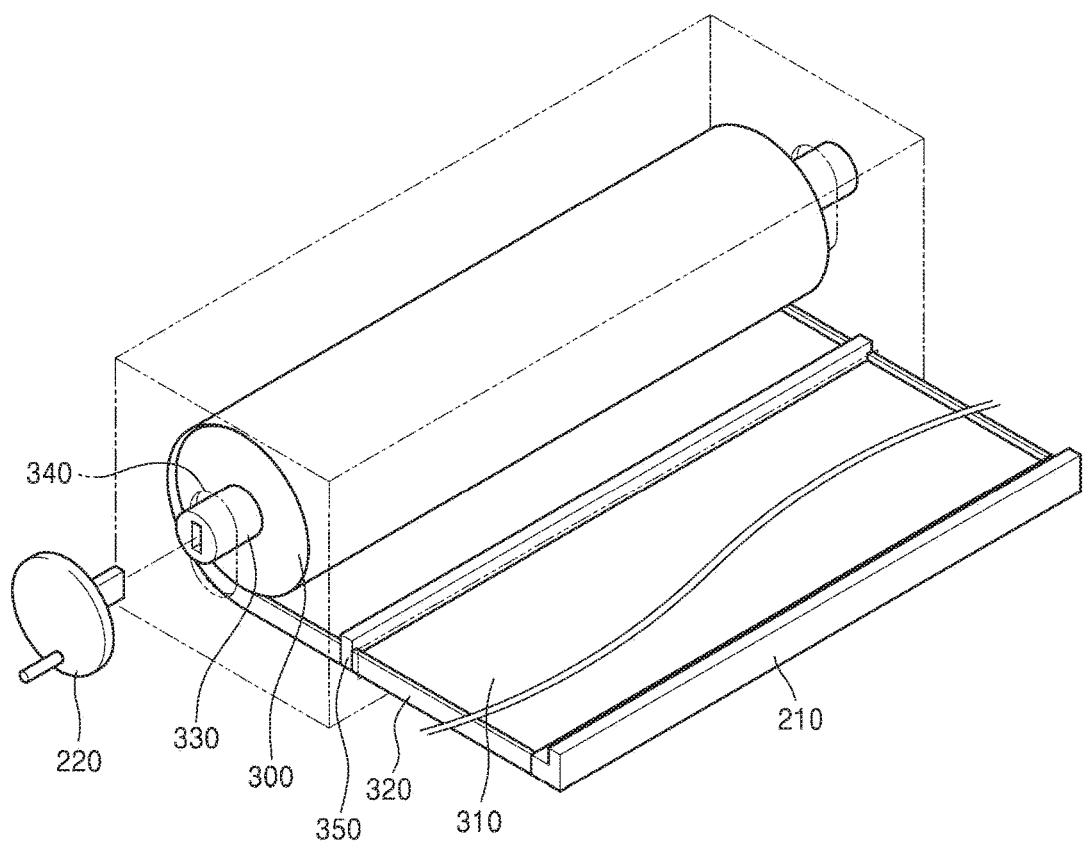
FIG. 3 is a perspective view of a roll included in an electronic device, and a flexible display wound on the roll, according to an embodiment.

FIG. 2 is a perspective view of the electronic device 101 according to an embodiment. FIG. 3 is a perspective view of a roll 300 included in the electronic device 101, and a flexible display 310 wound on the roll 300.

Referring to FIGS. 2 and 3, the electronic device 101 may include a housing 200, the roll 300 on which the flexible display 310 is wound, and the flexible display 310 wound on the roll 300 to retract into the housing 200 or unwound from the roll 300 to extend out of the housing 200.

The electronic device 101 has a structure capable of accommodating the flexible display 310 in the housing 200 in a wound state, and of extending and spreading the display 310 out of the housing 200 as necessary to provide information to a user.

To this end, an opening 400 is provided in a surface or at a side of the housing 200. The flexible display 310 may be unwound from the roll 300 and may extend out of the electronic device 101 through the opening 400 of the housing 200. When wound on the roll 300, the flexible display 310 may retract into the housing 200 through the opening 400.

An end of the flexible display 310 is connected to the roll 300. The flexible display 310 may be connected to the roll 300 directly or through a medium for transmitting signals between the flexible display 310 and the electronic device 101.

The roll 300 may rotate in the housing 200 to wind the flexible display 310 on a body of the roll 300. A handle 210 holdable by the user to extend the flexible display 310 out of the housing 200 may be provided at the other end of the flexible display 310.

A side protector 320 is provided at a width-direction side and the other width-direction side of the flexible display 310. The side protector 320 may protect the flexible display 310 from external impact. The side protector 320 may be thicker than the flexible display 310.

Referring to FIG. 3, when the flexible display 310 is wound on the roll 300 in a multilayer structure, a distance between an inner layer 311 and an outer layer 312 may be constantly maintained such that an outer surface of the inner layer 311 may not contact an inner surface of the outer layer 312. As such, wear and damage of the surface of the flexible display 310, i.e., a display surface on which an image is displayed, may be reduced.

A central shaft 330 of the roll 300 is rotatably supported in the housing 200. The roll 300 rotates with respect to the central shaft 330 of the roll 300 in the housing 200. The electronic device 101 may further include a winder 220 for rotating the roll 300. The winder 220 may be connected from outside the housing 200 to the central shaft 330 directly or through a motive power transmission device such as a gear, but is not limited thereto. The flexible display 310 may be wound on the roll 300 by rotating the roll 300 by using the winder 220.

When the roll 300 rotates, the flexible display 310 connected to the roll 300 is wound on or unwound from the roll 300. For example, when the user pulls the handle 210, the roll 300 rotates in a counterclockwise direction and the flexible display 310 is unwound from the roll 300 and extends out of the housing 200. When the user rotates the winder 220 connected to the central shaft 330 of the roll 300, the roll 300 rotates in a clockwise direction. Then, the flexible display 310 is wound on the roll 300 and retracts into the housing 200.

A stopper 350 may be mounted on a region of the flexible display 310 or on a region of the side protector 320. An area of the flexible display 310 extending out of the housing 200 may be determined based on a location of the stopper 350. For example, referring to FIG. 3, the stopper 350 may be mounted adjacent to the end of the flexible display 310 connected to the roll 300. As such, the flexible display 310 may extend outside only to where the stopper 350 is mounted.

In the electronic device 101 according to an embodiment, a part from where the stopper 350 is mounted to where the handle 210 is provided may be configured as the flexible display 310 and a part from where the flexible display 310 is connected to the roll 300 to where the stopper 350 is mounted may be configured as a component for transmitting electronic signals between the processor 120 and the flexible display 310 of the electronic device 101. In other words, in the flexible display 310, a region from where the stopper 350 is mounted to the other end where the handle 210 is provided may be an image display area for displaying an image, and a region from the end connected to the roll 300 to where the stopper 350 is mounted may be a signal transmission area on which a flexible printed circuit board (FPCB) or the like is provided to transmit/receive signals to/from the processor 120.

When the flexible display 310 is wound on or unwound from the roll 300, a distance from a center of the roll 300 to the flexible display 310 wound on the roll 300, i.e., an outer diameter of the roll 300, is increased or reduced. As such, although not shown in FIGS. 2 and 3, the flexible display 310 moves in a direction almost perpendicular to a direction in which the flexible display 310 is unwound from or wound on the roll 300, i.e., a radius direction of the roll 300. The movement of the flexible display 310 in the radius direction may cause shaking of a screen.

Figure 4:
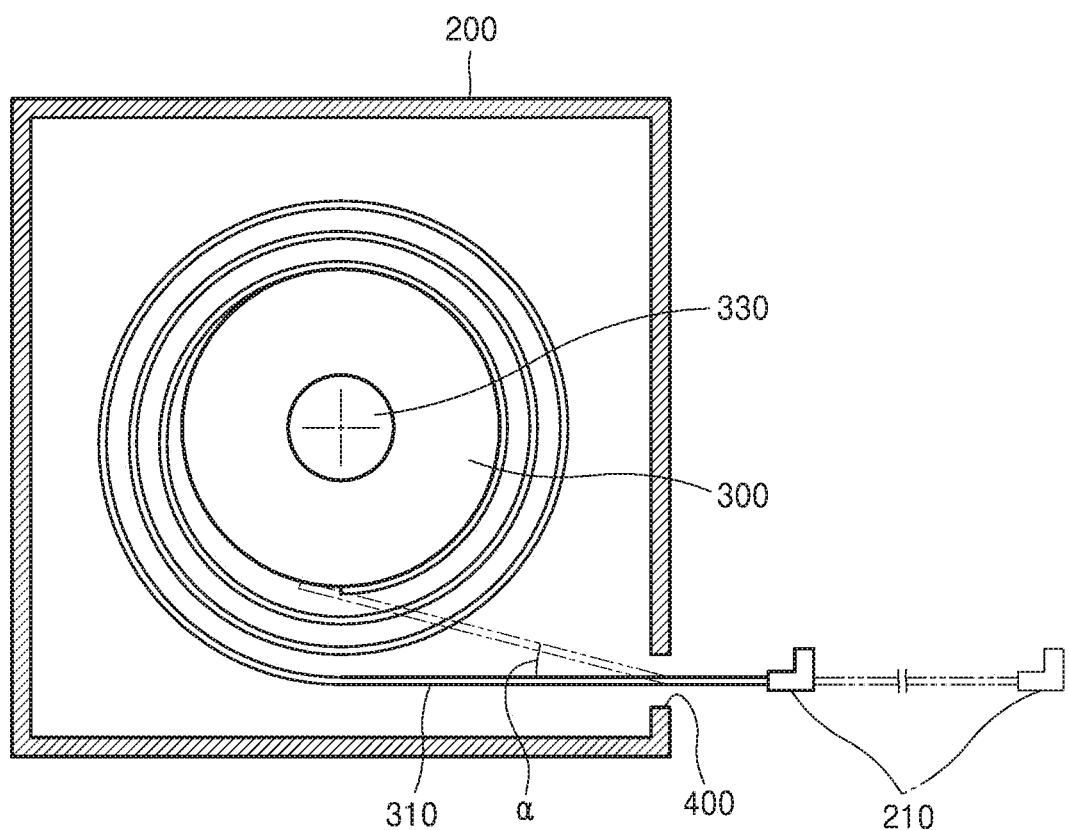
FIG. 4 is a side cross-sectional view showing that a flexible display is wound or unwound when a roll rotates at a fixed location.

FIG. 4 is a side cross-sectional view showing that the flexible display 310 is wound or unwound when the roll 300 rotates at a fixed location. As illustrated in FIG. 4, when the opening 400 of the housing 200 does not have a sufficient height, a proceeding direction of the flexible display 310 with respect to the opening 400 in the housing 200 may be continuously changed and thus the opening 400 may be damaged.

In a first state in which the flexible display 310 is completely wound on the roll 300 as indicated by a solid line in FIG. 4, the flexible display 310 passes through the opening 400 in an almost horizontal direction. However, in a second state in which the flexible display 310 is completely unwound from the roll 300 as indicated by a two-dot chain line in FIG. 4, the flexible display 310 passes through the opening 400 in a direction inclined with respect to the direction of the first state by an angle α. Since the flexible display 310 is repeatedly bent while extending/retracting, fatigue may be accumulated and thus the flexible display 310 may be damaged.

A method capable of reducing repeated bending of the flexible display 310 in a direction perpendicular to a direction of the flexible display 310 that enters and exits the housing 200 through the opening 400, and of constantly maintaining a proceeding direction of the flexible display 310 with respect to the opening 400 in the housing 200 may be considered.

As an example of the method, the roll 300 may be supported in the housing 200 to move in a direction capable of compensating for a variation in the outer diameter thereof. For example, the roll 300 may be guided by a roll guide 340 provided in the housing 200. The roll guide 340 may have, for example, a slot shape, and two ends of the central shaft 330 of the roll 300 are inserted into a pair of roll guides 340. Due to the above-described configuration, the roll 300 may move along the roll guide 340 in accordance with the variation in the outer diameter thereof. The movement of the roll 300 may occur simultaneously with rotation of the roll 300.

Embodiments of a structure in which the roll 300 moves in accordance with a variation in a wound length of the flexible display 310 on the roll 300 will now be described.

Figure 5:
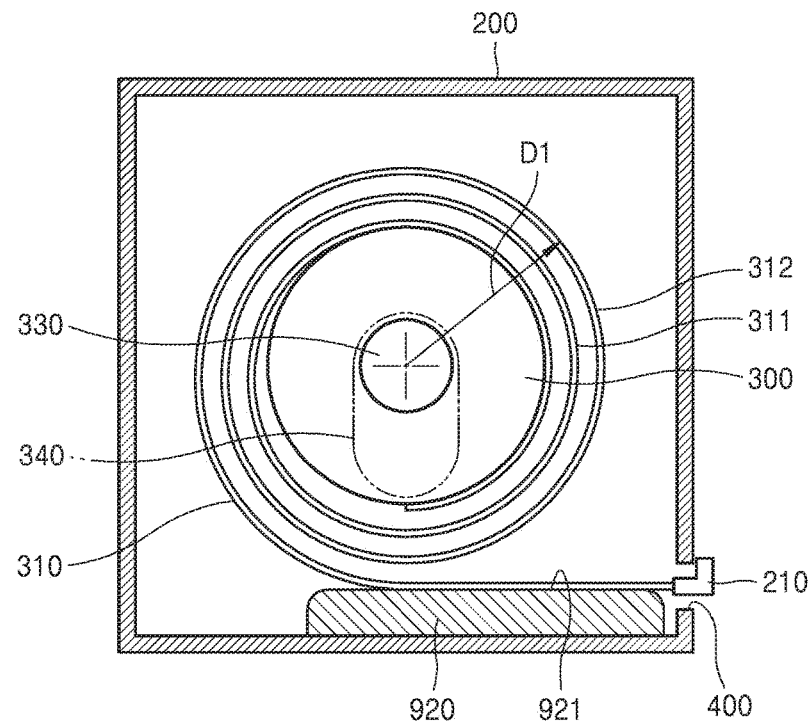
FIGS. 5 and 6 are side cross-sectional views of an electronic device according to an embodiment.
Figure 6:
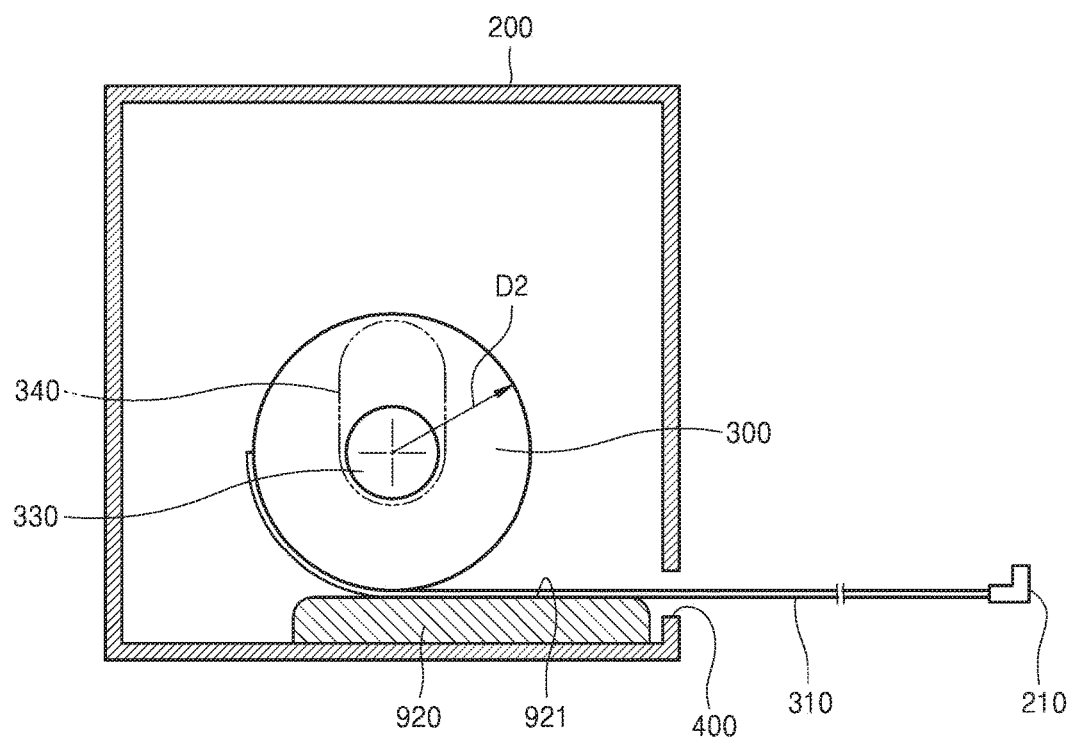

FIGS. 5 and 6 are side cross-sectional views of the electronic device 101 according to an embodiment. FIG. 5 shows a state in which the flexible display 310 is completely wound on the roll 300, and FIG. 6 shows a state in which the flexible display 310 is completely unwound from the roll 300.

Referring to FIG. 5, an end of the flexible display 310 is connected to the roll 300 and the other end thereof is connected to the handle 210. The flexible display 310 is wound on the roll 300 and is positioned in the housing 200. When the flexible display 310 extends out of the housing 200, the roll 300 and the central shaft 330 rotate together. In this case, the roll 300 may rotate with respect to the central shaft 330, and the central shaft 330 may be supported by the housing 200 to move along the roll guide 340. Referring to FIG. 6, the flexible display 310 is unwound from the roll 300 and extends out of the housing 200.

When the flexible display 310 extends out of the housing 200, an outer diameter of the roll 300 varies. When the outer diameter of the roll 300 in FIG. 5 is D1, the outer diameter of the roll 300 in FIG. 6 is D2 less than D1. The roll guide 340 guides the roll 300 in such a manner that the roll 300 moves to compensate for a variation (D1-D2) in the outer diameter of the roll 300. Herein, each of the outer diameters D1 and D2 refers to a total outer diameter including the flexible display 310 wound on the roll 300.

In FIGS. 5 and 6, the roll guide 340 guides the central shaft 330 in such a manner that the roll 300 moves downward as the flexible display 310 extends from the housing 200. In the current embodiment, a display guide 920 is positioned under the roll 300 in the direction of gravity, and supports the flexible display 310 wound on the roll 300. The display guide 920 extends toward the opening 400 in a direction equal to a direction in which the flexible display 310 extends out of the housing 200. The display guide 920 is provided adjacent to the opening 400.

Although the display guide 920 is positioned at a lower side in the direction of gravity in the following description for convenience of explanation, the electronic device 101 may be used in a state in which the central shaft 330 of FIGS. 5 and 6 stands upright in the direction of gravity. In this case, the location of the display guide 920 is not under the roll 300 in the direction of gravity, and the display guide 920 may extend toward the opening 400 in a direction equal to a direction in which the flexible display 310 extends out of the housing 200.

When the flexible display 310 extends or retracts, the display guide 920 may contact the surface of the flexible display 310 or the side protector 320 of the flexible display 310 to reduce shaking of the flexible display 310. Therefore, as the flexible display 310 is unwound from the roll 300, the roll 300 is guided by the roll guide 340 to move downward and a movement distance thereof is limited by the display guide 920.

The display guide 920 guides the flexible display 310 toward the opening 400. The display guide 920 of the current embodiment guides the flexible display 310 to pass through the opening 400 in a horizontal direction. To this end, a supporting surface 921 of the display guide 920, which supports the flexible display 310, extends toward the opening 400.

As such, a proceeding direction of a part of the flexible display 310 positioned in the housing 200, i.e., a part of the flexible display 310 between the roll 300 and the opening 400, may be constantly maintained as a certain direction, e.g., a horizontal direction. Although not shown in FIGS. 5 and 6, when the electronic device 101 is used in a state in which the central shaft 330 stands upright in the direction of gravity, the proceeding direction of the flexible display 310 may be constantly maintained as a vertical direction.

The roll guide 340 extends in the direction of gravity, i.e., a direction almost perpendicular to a proceeding direction of the flexible display 320 unwound from the roll 300 and proceeding toward the opening 400 in the housing 200, in FIGS. 5 and 6, but is not limited thereto. The roll guide 340 may have various shapes capable of compensating for the variation (D1-D2) in the outer diameter of the roll 300.

Figure 7:
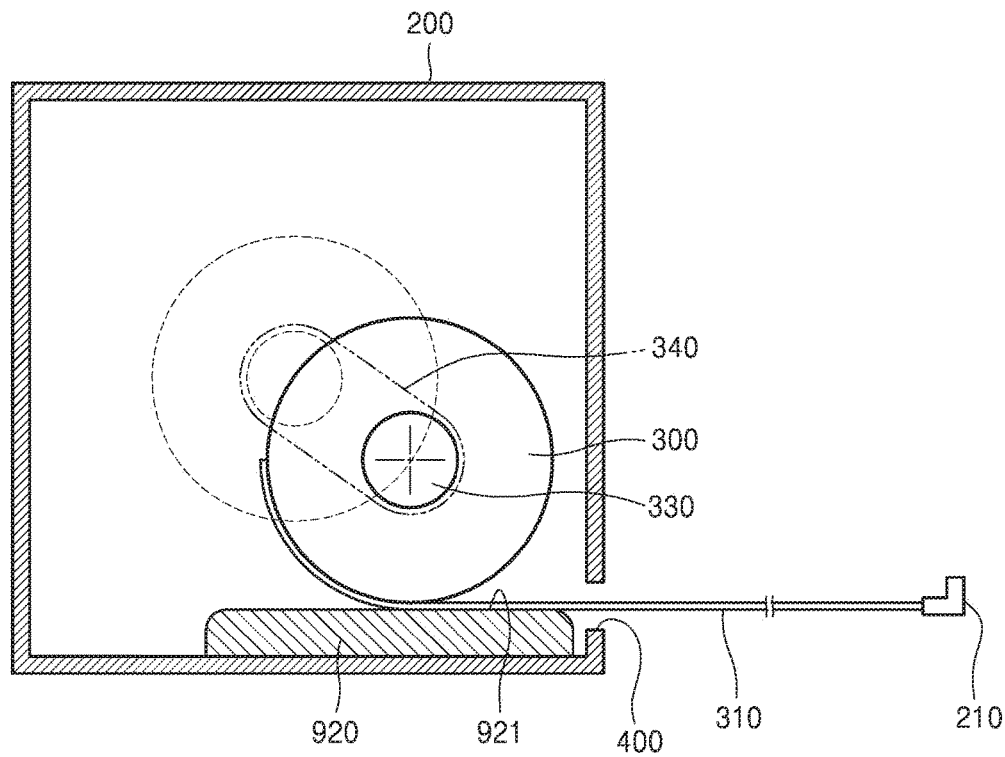
FIG. 7 is a side cross-sectional view showing that a roll of an electronic device moves toward an opening, according to an embodiment.

FIG. 7 is a side cross-sectional view of the electronic device 101 according to an embodiment.

Referring to FIG. 7, the roll guide 340 is inclined downward with respect to the direction of gravity. In other words, the roll guide 340 is inclined with respect to a proceeding direction of the flexible display 320 unwound from the roll 300 and proceeding toward the opening 400 in the housing 200. In this case, the inclined direction of the roll guide 340 may be a direction toward the opening 400. As such, a distance between the roll 300 and the opening 400 may be reduced and thus a length of an effective image display area of the flexible display 310 may be increased.

Since the roll 300 rotates and moves as described above, the flexible display 310 unwound from the roll 300 may always proceed toward the opening 400 in the same direction. That is, a part of the flexible display 310 between the roll 300 and the opening 400 may constantly maintain the same proceeding direction toward the opening 400 in a state in which the flexible display 310 is positioned in the housing 200, a state in which a part of the flexible display 310 extends out of the housing 200, and a state in which an extendable area of the flexible display 310 completely extends out of the housing 200.

Figure 8:
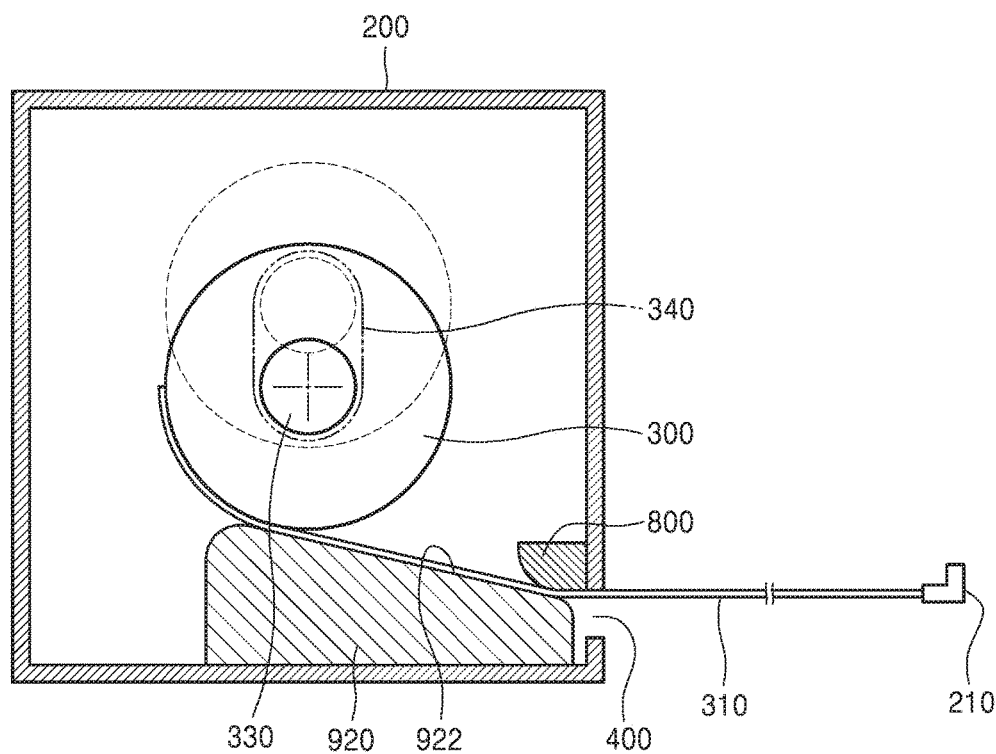
FIG. 8 is a side cross-sectional view of an electronic device including a display guide, according to embodiment.

The proceeding direction of the flexible display 310 for interconnecting the roll 300 and the opening 400 may not be a horizontal direction. FIG. 8 is a side cross-sectional view of the electronic device 101 according to embodiment.

Referring to FIG. 8, the display guide 920 includes a supporting surface 922 inclined with respect to a horizontal direction. For example, in the current embodiment, the supporting surface 922 is inclined downward toward the opening 400. Due to the above-described configuration, as the flexible display 310 is unwound from the roll 300, the roll 300 may be naturally guided by the roll guide 340 to move downward, and the flexible display 310 unwound from the roll 300 may be guided along the supporting surface 922 to extend out of the housing 200 through the opening 400.

Therefore, a proceeding direction of a part of the flexible display 310 between the roll 300 and the opening 400 may be constantly maintained. A guide member 800 for guiding the proceeding direction of the flexible display 310 passing through the opening 400 may be provided at an upper side of the opening 400 with respect to a direction in which the flexible display 310 is unwound.

The guide member 800 guides the flexible display 310 at a side opposite to the display guide 920 with respect to the flexible display 310 interposed between the guide member 800 and the display guide 920. The guide member 800 may, for example, guide the flexible display 310 to proceed in a horizontal direction after passing through the opening 400.

Inclination of the guide member 800 may be designed in consideration of a curvature by which the flexible display 310 is bendable. That is, the inclination of the guide member 800 may be designed to have a curvature greater than the maximum curvature of the flexible display 310. As such, even when the flexible display 310 bent by a certain curvature by the guide member 800 passes through the opening 400, fatigue due to the bending may not accumulated in the flexible display 310.

Figure 9:
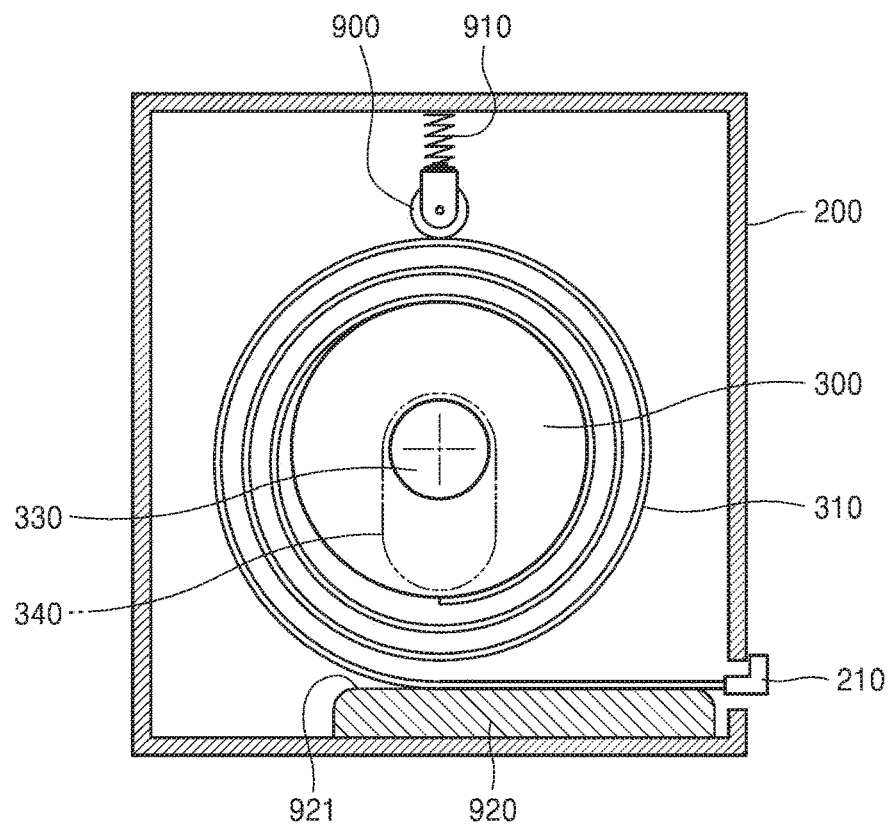
FIG. 9 is a side cross-sectional view of an electronic device including a push member, according to embodiment.

FIG. 9 is a side cross-sectional view of the electronic device 101 according to an embodiment.

Referring to FIG. 9, a push member 900 is illustrated. The roll 300 is positioned between the display guide 920 and the push member 900. The push member 900 pushes the roll 300 toward the display guide 920 in such a manner that the flexible display 310 wound on the roll 300 contacts the supporting surface 921.

In FIG. 9, the push member 900 pushes the flexible display 310 wound on the roll 300. The push member 900 may contact the flexible display 310 or the side protector 320. The push member 900 may be provided in the form of a roller that rotates as the roll 300 rotates, to reduce frictional contact with the flexible display 310 or the side protector 320 (see FIG. 3).

The push member 900 may push the roll 300 toward the display guide 920 due to a self weight thereof. As illustrated in FIG. 9, an elastic member 910 for applying elastic force to the push member 900 in a direction capable of pushing the roll 300 toward the display guide 920 may be further provided.

The display guide 920 supports the flexible display 310 wound on the roll 300, and guides the flexible display 310 unwound from the roll 300, toward the opening 400.

The flexible display 310 may be pushed by the push member 900 and supported by the display guide 920 and thus may be stably held in a wound state on the roll 300. In addition, even when the flexible display 310 is wound on or unwound from the roll 300, the push member 900 aids stable extension and retraction of the flexible display 310 by reducing movement of the roll 300 in directions other than a direction in which the roll 300 is rolled or unrolled.

A structure in which the roll 300 is pushed toward the display guide 920 by using the push member 900 and the elastic member 910 may be applied to the embodiment of FIG. 8 such that the flexible display 310 wound on the roll 300 may be pushed toward the supporting surface 922 of the display guide 920.

Figure 10:
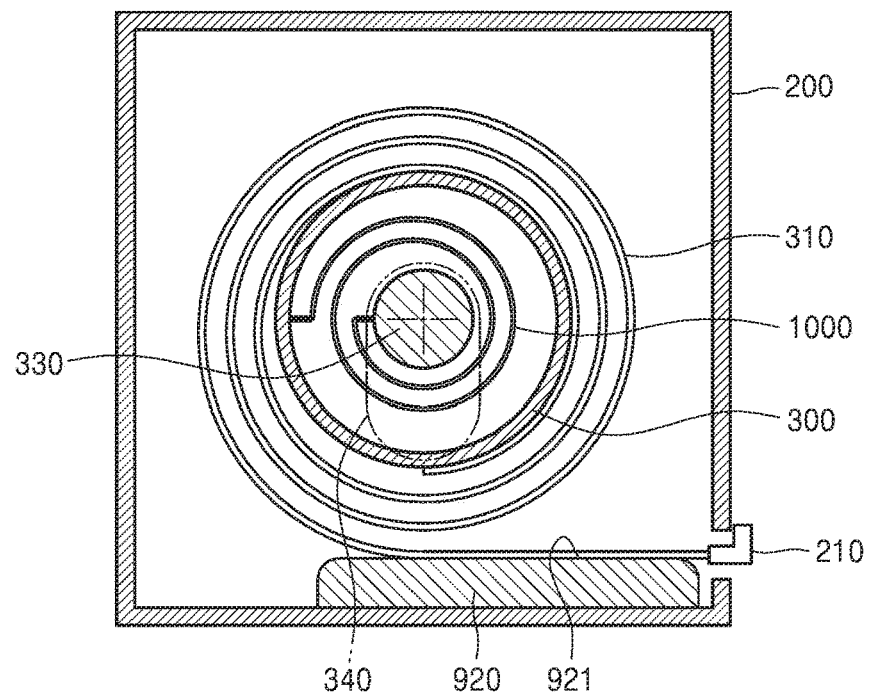
FIGS. 10 and 11 are side cross-sectional views of an electronic device including a winding member, according to embodiment.
Figure 11:
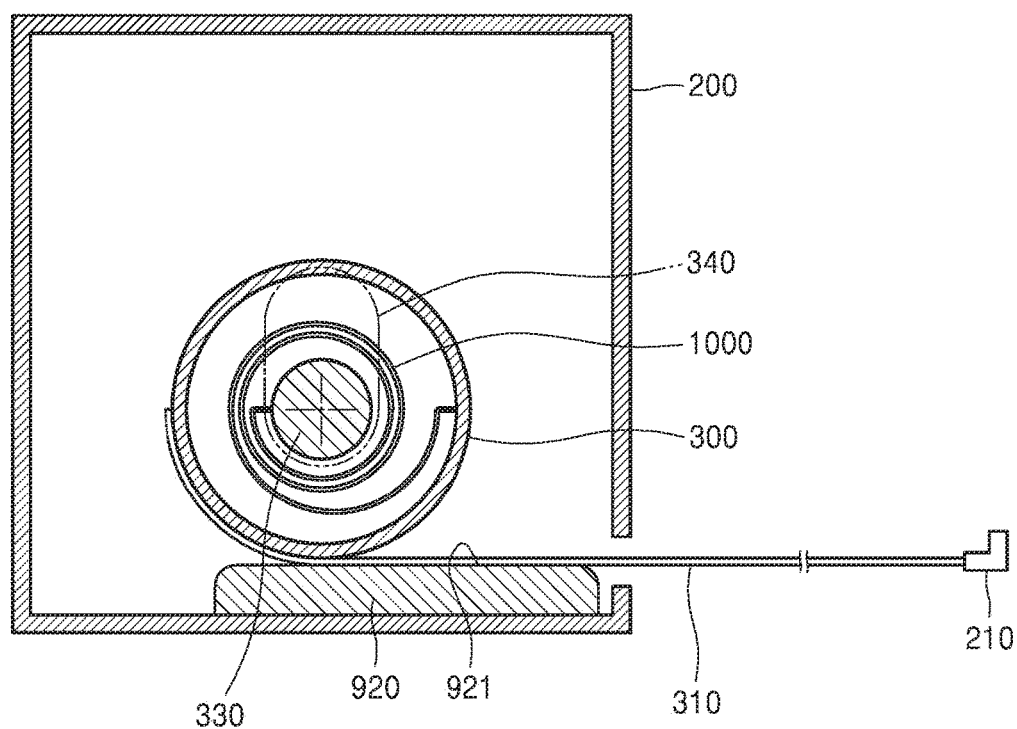

FIGS. 10 and 11 are side cross-sectional views of the electronic device 101 according to an embodiment. The electronic device 101 of the current embodiment may include a winding member for providing elastic force to the roll 300 in such a manner that the roll 300 rotates in a direction capable of winding the flexible display 310 thereon. Referring to FIGS. 10 and 11, the winding member may be implemented by, for example, a spiral spring 1000.

An end of the spiral spring 1000 may be connected to the roll 300, and the other end thereof may be connected to the housing 200. Alternatively, the end of the spiral spring 1000 may be connected to the roll 300 and the other end thereof may be connected to the central shaft 330. In this case, the roll 300 has a structure rotatable with respect to the central shaft 330, and the central shaft 330 does not rotate with respect to the housing 200 but is merely supported by the housing 200 to move along the roll guide 340. In the current embodiment, the other end of the spiral spring 1000 is connected to the central shaft 330.

Referring to FIG. 11, when the flexible display 310 starts to extend out of the housing 200, the roll 300 rotates in a counterclockwise direction. The spiral spring 1000 accumulates elastic force as the roll 300 rotates. The elastic force accumulated by the spiral spring 1000 is used to retract the flexible display 310 extended out of the housing 200, into the housing 200 to wind the flexible display 310 on the roll 300.

Figure 12:
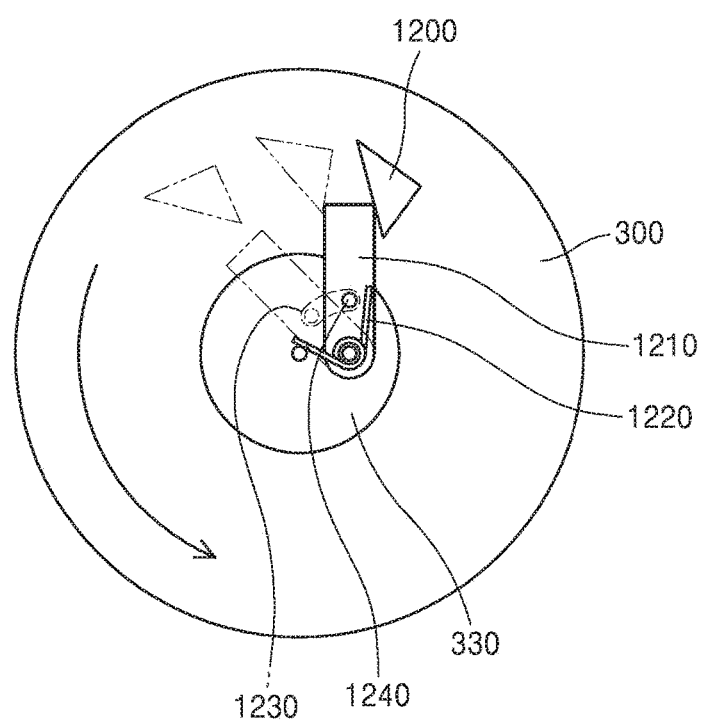
FIG. 12 is a structural view of a locking unit according to an embodiment.

The electronic device 101, which retracts the flexible display 310 into the housing 200 by using the spiral spring 1000, may include a locking unit capable of holding the flexible display 310 in an extended state. FIG. 12 is a structural view of a locking unit according to an embodiment.

Referring to FIG. 12, the locking unit may be implemented by a stopper projection 1200 and a stopper lever 1210. The stopper projection 1200 is provided on the roll 300. The stopper projection 1200 may be provided at a side or two sides of the roll 300. As necessary, a plurality of stopper projections 1200 may be provided in a rotation direction of the roll 300. The number of stopper projections 1200 may be determined in consideration of a diameter of the roll 300 or a length of the flexible display 310. For example, when the plurality of stopper projections 1200 are provided, a length of the flexible display 310 extending out of the housing 200 may be adjusted in multiple stages.

The stopper lever 1210 may be provided on the housing 200. Alternatively, in a structure in which the central shaft 330 is supported by the housing 200 and the roll 300 rotates with respect to the central shaft 330, the stopper lever 1210 may be provided on the central shaft 330. In the current embodiment, the stopper lever 1210 is provided on the central shaft 330.

An end of the stopper lever 1210 is rotatably supported by the central shaft 330. The stopper lever 1210 may rotate to a contact location (indicated by a solid line in FIG. 12) at which the other end of the stopper lever 1210 contacts the stopper projection 1200, and a release location (indicated by a two-dot chain line in FIG. 12) at which the other end of the stopper lever 1210 is released from the stopper projection 1200. The spring 1220 provides elastic force to the stopper lever 1210 in a direction capable of holding the stopper lever 1210 at the contact location.

Referring to FIG. 12, when the roll 300 rotates in a counterclockwise direction to extend the flexible display 310 out of the housing 200, the stopper projection 1200 contacts the stopper lever 1210 mounted on the central shaft 330. In this state, when the roll 300 further rotates in the counterclockwise direction, the stopper lever 1210 is pushed by the stopper projection 1200 and rotates in a direction opposite to a direction of the elastic force of the spring 1220.

As the stopper lever 1210 is pushed by the stopper projection 1200 and rotates, a length of a superposed part between the stopper lever 1210 and the stopper projection 1200 is gradually reduced. When the roll 300 further rotates in the counterclockwise direction, the stopper lever 1210 is positioned at the release location, the stopper projection 1200 is released from the stopper lever 1210, and the roll 300 may continuously rotate in the counterclockwise direction. The stopper lever 1210 returns to the contact location due to the elastic force of the spring 1220.

When the roll 300 stops rotating in the counterclockwise direction, the roll 300 rotates in a clockwise direction due to the elastic force of the spiral spring 1000. As the roll 300 rotates in the clockwise direction, the stopper projection 1200 contacts the stopper lever 1210. The stopper lever 1210 may rotate from the contact location to the release location, but is restricted so as not to rotate beyond the contact location. A restriction member for the restriction may be implemented by, for example, a restriction slot 1230 provided in the central shaft 330, and a restriction protrusion 1240 provided on the stopper lever 1210 and inserted into the restriction slot 1230. Accordingly, when the stopper projection 1200 rotates in the clockwise direction and contacts the stopper lever 1210 positioned at the contact location, the roll 300 may no more rotate in the clockwise direction and the display 310 is held in an extended state.

The electronic device 101 needs to release a locked state of the stopper lever 1210 and the stopper projection 1200 to retract the held display 310 into the housing 200. For example, the electronic device 101 may rotate the stopper lever 1210 to the release location. To this end, although not shown in FIG. 12, to allow a user to manually manipulate and rotate the stopper lever 1210 to the release location, a part of the stopper lever 1210 may be exposed outside the housing 200. In addition, although not shown in FIG. 12, a release lever for manually manipulating and rotating the stopper lever 1210 exposed outside the housing 200, to the release location may be further provided.

Figure 13:
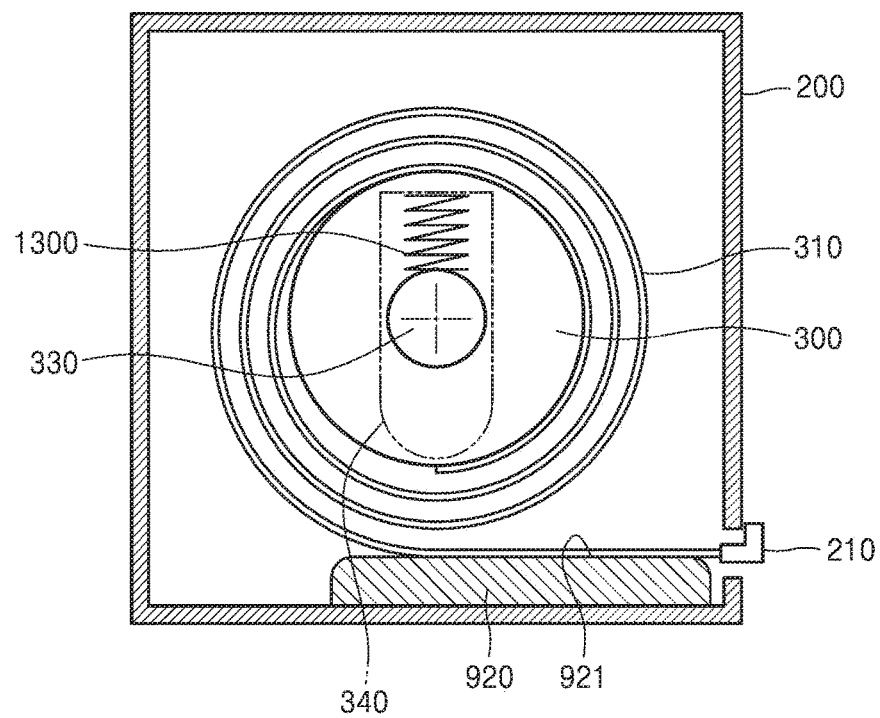
FIGS. 13 and 14 are side cross-sectional views of an electronic device including a roll spring, according to an embodiment.
Figure 14:
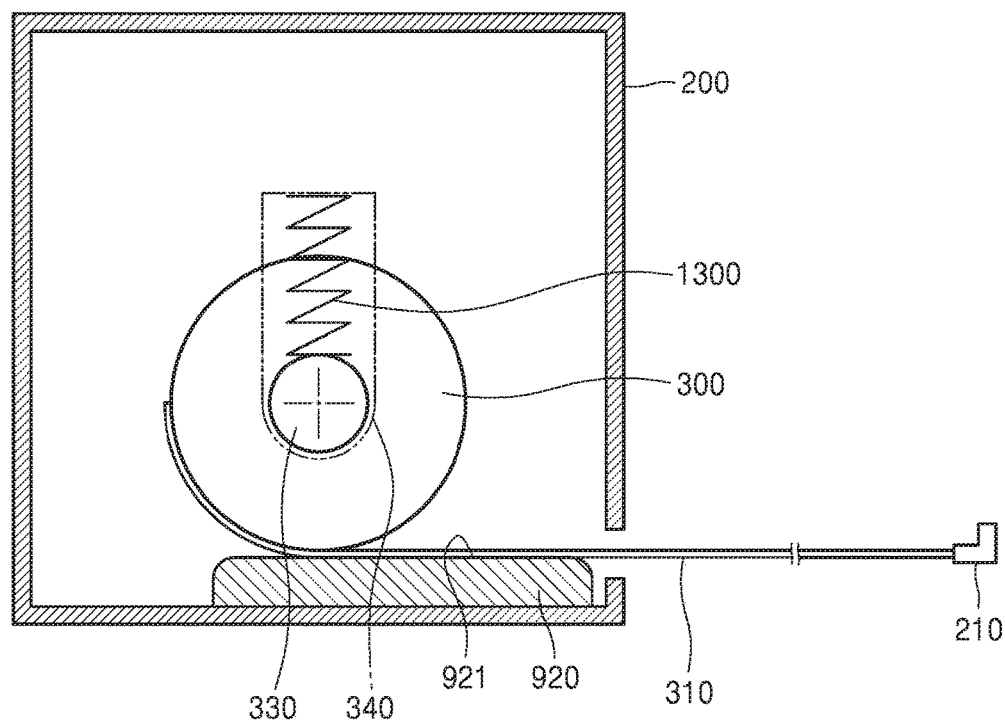

FIGS. 13 and 14 are side cross-sectional views of the electronic device 101 according to an embodiment.

Referring to FIGS. 13 and 14, the push member 900 may be implemented by a roll spring 1300. The roll spring 1300 is supported by the roll guide 340 and pushes the roll 300 toward the display guide 920. The roll spring 1300 pushes the central shaft 330.

The flexible display 310 wound on the roll 300 is held in contact with the display guide 920, by the roll spring 1300. Therefore, the flexible display 310 may be held in a wound state on the roll 300. In addition, as the flexible display 310 is unwound from the roll 300, the roll 300 may more easily move downward and the flexible display 310 may be held in contact with the display guide 920.

The push member 900 and the elastic member 910 of FIG. 9 may be applied to the electronic device 101 illustrated in FIGS. 13 and 14. As such, the flexible display 310 may be more stably held in a wound state on the roll 300.

The electronic device 101 illustrated in FIGS. 13 and 14 may include a spiral spring (not shown) between the roll 300 and the central shaft 330. The spiral spring may be provided at the same location as and may perform the same function as the spiral spring 1000 described above in relation to FIGS. 10 and 11.

The electronic device 101, which retracts the flexible display 310 into the housing 200 by using the spiral spring 1000, may include a locking unit capable of holding the flexible display 310 in an extended state. The locking unit may hold the extended flexible display 310. The locking unit may be implemented by the stopper projection 1200 and the stopper lever 1210 described above in relation to FIG. 12.

When the flexible display 310 enters and exits the housing 200 through the opening 400, a certain relationship may be established between rotation of the roll 300 and movement of the roll 300 along the roll guide 340.

Figure 15:
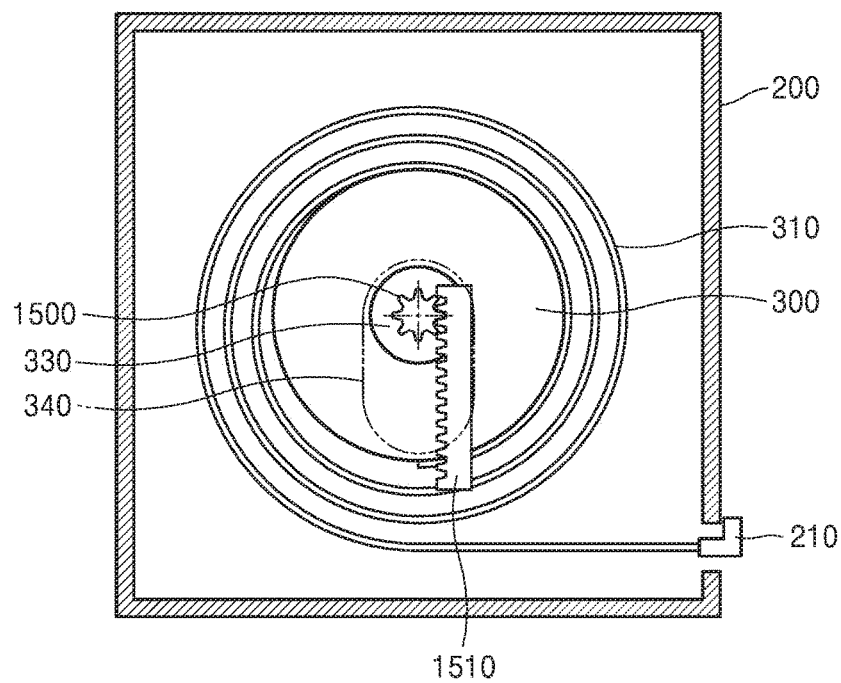
FIGS. 15 and 16 are side cross-sectional views of an electronic device including a pinion gear and a rack gear, according to an embodiment.

Referring to FIG. 15, a pinion gear 1500 is illustrated. The pinion gear 1500 may be provided on, for example, the roll 300. In a structure in which the central shaft 330 rotates together with the roll 300, the pinion gear 1500 may be provided on the central shaft 330. In the current embodiment, the pinion gear 1500 is provided on the central shaft 330. The pinion gear 1500 engages with a rack gear 1510 extending in a movement direction of the roll 300, i.e., an extension direction of the roll guide 340. The rack gear 1510 is positioned at a fixed location. For example, the rack gear 1510 may be provided on the housing 200. As the flexible display 310 is wound on or unwound from the roll 300, the pinion gear 1500 may move along the rack gear 1510 in an extension direction of the rack gear 1510.

The pinion gear 1500 may be designed to move along the rack gear 1510 by a variation in an outer diameter of the roll 300 including the flexible display 310, when the flexible display 310 is wound on the roll 300 in a multilayer structure. That is, when the flexible display 310 wound on the roll 300 is unwound or further wound by a layer, the roll 300 may move along the roll guide 340 by a thickness of the flexible display 310 such that a proceeding direction of the flexible display 310 with respect to the opening 400 may be constantly maintained.

When a diameter of the pinion gear 1500 is Dp, the number of turns of the pinion gear 1500 is Np, and a movement distance of the pinion gear 1500 along the rack gear 1510 is L, $$L = Dp * \pi * Np \qquad \text{Equation (1)}$$

is satisfied.

Figure 16:
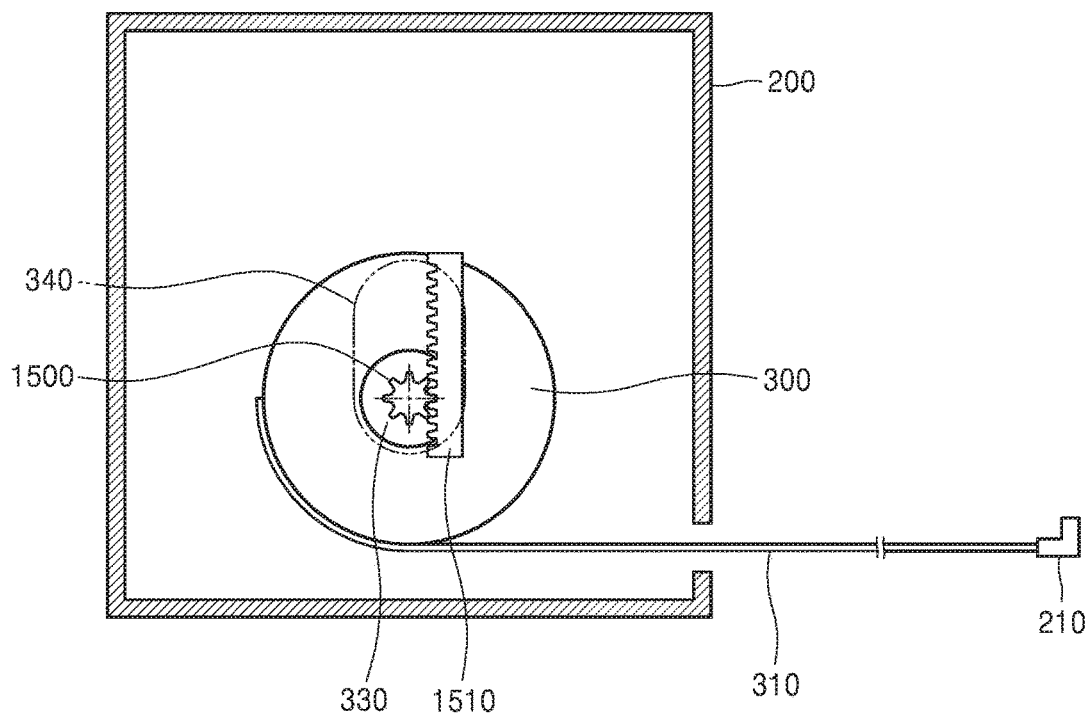

Referring to FIG. 16, the pinion gear 1500 moves along the rack gear 1510 and is positioned at a location under the location of FIG. 15, and the flexible display 310 is in an extended state. As described above, the pinion gear 1500 may move by an increase or a reduction in the thickness of the flexible display 310 wound on or unwound from the roll 300. Therefore, while the roll 300 is moving together with the pinion gear 1500, a proceeding direction of the flexible display 310 toward the opening 400 may be constantly maintained.

The electronic device 101 according to the current embodiment may include a display guide (not shown), a push member (not shown), and an elastic member (not shown) for appropriate extension and retraction of the flexible display 310. The display guide, the push member, and the elastic member of the current embodiment may be provided at the same locations as and may perform the same functions as the display guide 920, the push member 900, and the elastic member 910 described above in relation to FIG. 9.

The electronic device 101 according to the current embodiment may include a spiral spring (not shown) for interconnecting the roll 300 and the central shaft 330. The spiral spring of the current embodiment may be provided at the same location as and may perform the same function as the spiral spring 1000 described above in relation to FIGS. 10 and 11.

The electronic device 101, which retracts the flexible display 310 into the housing 200 by using the spiral spring 1000, may include a locking unit capable of holding the flexible display 310 in an extended state. The locking unit may hold the extended flexible display 310. The locking unit may employ a structure of the stopper projection 1200 and the stopper lever 1210 described above in relation to FIG. 12.

In a structure including only the rack gear 1510 and the pinion gear 1500, the diameter of the pinion gear 1500 is reduced in proportion to the thickness of the flexible display 310. Therefore, in consideration of production errors and durability of the pinion gear 1500, a gear reduction structure may be interposed between the rack gear 1510 and the pinion gear 1500.

Figure 17:
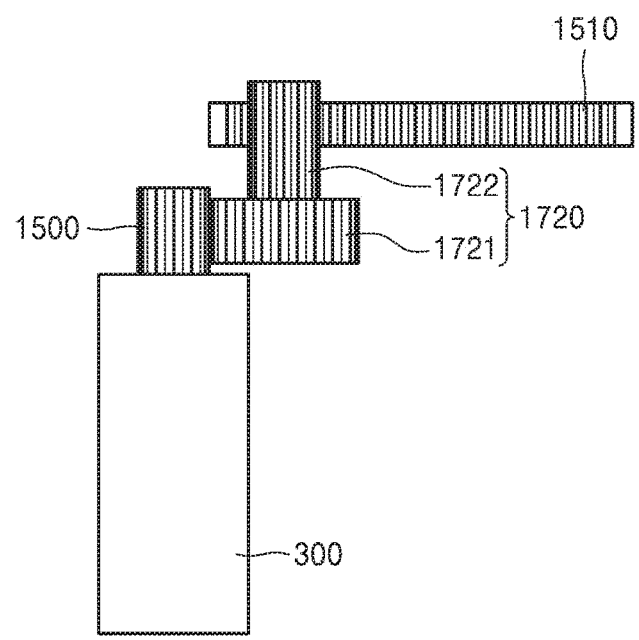
FIGS. 17 and 18 are structural views of a reduction gear(s) of an electronic device, according to embodiments.

FIG. 17 is a structural view of a reduction structure according to an embodiment.

Referring to FIG. 17, a reduction gear 1720 is interposed between the pinion gear 1500 and the roll 300.

The reduction gear 1720 is a double gear including a first gear part 1721 engaging with the pinion gear 1500, and a second gear part 1722 engaging with the rack gear 1510. A diameter of the first gear part 1721 is greater than a diameter of the second gear part 1722. Although not shown in FIG. 17, the reduction gear 1720 may be provided on a bracket (not shown) for rotatably supporting the roll 300. The bracket is supported by the housing 200 to move together with the roll 300.

When the diameter of the first gear part 1721 is D1 and the diameter of the second gear part 1722 is D2, the pinion gear 1500 is connected to the rack gear 1510 at a reduction gear ratio of D2/D1. Therefore, when a diameter of the pinion gear 1500 is Dp1, a movement distance of the roll 300 is L1, and the number of turns of the pinion gear 1500 is Np, $$L1 = Dp1 * (D2/D1) * Np * \pi \qquad \text{Equation (2)}$$

is satisfied.

Herein, if L of Equation (1) equals L1 of Equation (2), the diameter Dp1 of the pinion gear 1500 satisfies Dp1=(D1/D2)*Dp. Since D1>D2, Dp1>Dp is satisfied. Therefore, since the diameter of the pinion gear 1500 may be increased by (D1/D2) times, the pinion gear 1500 having a size appropriate for production may be employed by appropriately selecting the diameters of the first and second gear parts 1721 and 1722, and durability of the pinion gear 1500 may be increased.

Figure 18:
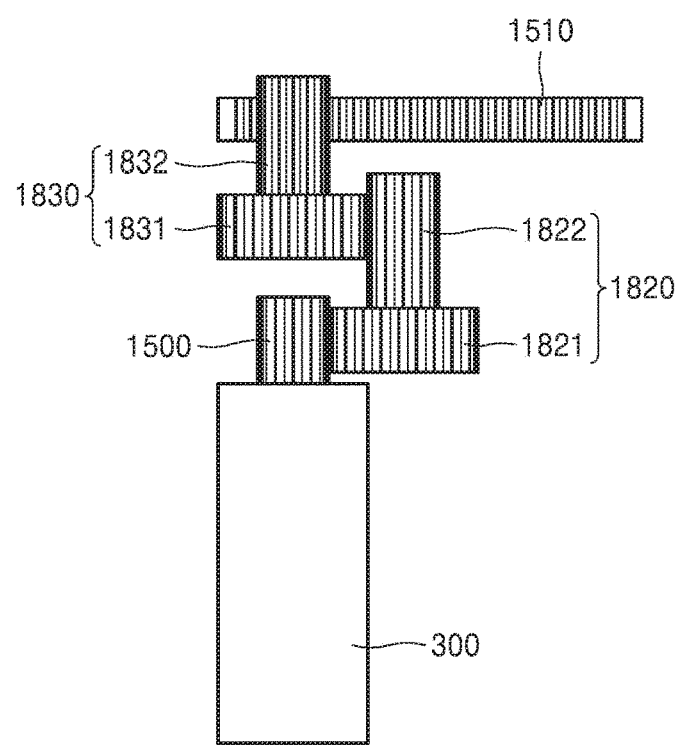

As necessary, two or more reduction gears may be employed. FIG. 18 is a structural view of a reduction structure according to an embodiment. Referring to FIG. 18, first and second reduction gears 1820 and 1830 are interposed between the pinion gear 1500 and the rack gear 1510.

The first reduction gear 1820 is a double gear including first and second gear parts 1821 and 1822. The second reduction gear 1830 is a double gear including third and fourth gear parts 1831 and 1832. The first gear part 1821 engages with the pinion gear 1500. The second gear part 1822 engages with the third gear part 1831. The fourth gear part 1832 engages with the rack gear 1510.

A diameter of the first gear part 1821 is greater than a diameter of the second gear part 1822. A diameter of the third gear part 1831 is greater than a diameter of the fourth gear part 1832. Although not shown in FIG. 18, the first and second reduction gears 1820 and 1830 may be provided on a bracket (not shown) for rotatably supporting the roll 300. The bracket is supported by the housing 200 to move together with the roll 300.

When the diameters of the first, second, third, and fourth gear parts 1821, 1822, 1831, and 1832 are D1, D2, D3, and D4, respectively, the pinion gear 1500 is connected to the rack gear 1510 at a reduction gear ratio of (D2/D1)*(D4/D3). Therefore, when a diameter of the pinion gear 1500 is Dp2, a movement distance of the roll 300 is L2, and the number of turns of the pinion gear 1500 is Np, $$L2 = Dp2 * (D2/D1) * (D4/D3) * Np * \pi \qquad \text{Equation (3)}$$

is satisfied.

Herein, if L of Equation (1) equals L2 of Equation (3), the diameter Dp1 of the pinion gear 1500 satisfies Dp2=(D1/D2)*(D3/D4)*Dp. Since D1>D2 and D3>D4, Dp2>Dp is satisfied. Therefore, since the diameter of the pinion gear 1500 may be increased by (D1/D2)*(D3/D4) times, the pinion gear 1500 having a size appropriate for production may be employed by appropriately selecting the diameters of the first to fourth gear parts 1821, 1822, 1831, and 1832, and durability of the pinion gear 1500 may be increased. In addition, since gear reduction occurs twice, when Dp1 equals Dp2, the first and second reduction gears 1820 and 1830 may have sizes less than a size of the reduction gear 1720 and thus a compact gear reduction structure applicable to a small space may be implemented.

Figure 19:
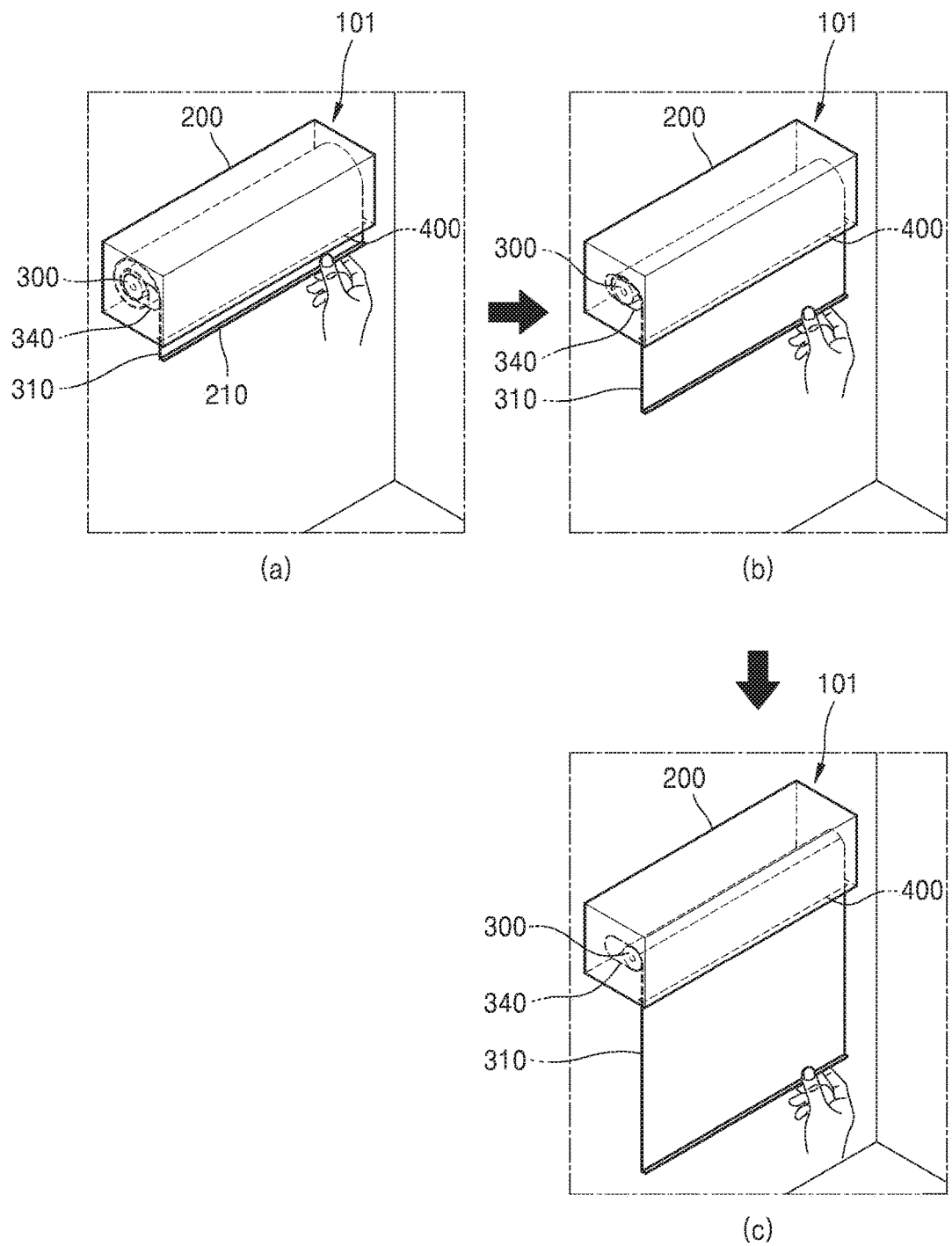
FIGS. 19 and 20 are perspective views showing that a flexible display extends out of an electronic device, according to embodiments.

FIG. 19 includes perspective views showing usage of the electronic device 101 using the afore-described structures. Herein, the electronic device 101 may be, for example, a rollable TV or screen.

Referring to FIG. 19(*a*), the electronic device 101 may be fixed to a wall in such a manner that the opening 400 faces downward. The flexible display 310 is completely wound on the roll 300 and accommodated in the housing 200. The roll 300 is positioned, for example, at a rear end of the roll guide 340. A user may extend the flexible display 310 out of the housing 200 by holding and pulling downward the handle 210 positioned at a front end of the flexible display 310.

FIG. 19(*b*) shows that the flexible display 310 partially extends downward through the opening 400 of the housing 200. FIG. 19(*c*) shows that the flexible display 310 mostly extends downward through the opening 400 of the housing 200. As illustrated in FIGS. 19(*b*) and 19(*c*), the roll 300 moves forward along the roll guide 340 as the flexible display 310 is unwound from the roll 300 and extends through the opening 400, and reaches a front end of the roll guide 340 when the flexible display 310 completely extends. When the flexible display 310 is wound on the roll 300, a wound length of the flexible display 310 on the roll 300 is increased and the roll 300 moves backward along the roll guide 340. Therefore, even when the wound length of the flexible display 310 on the roll 300 varies, a proceeding direction of the flexible display 310 with respect to the opening 400 in the housing 200 may be constantly maintained.

Figure 20:
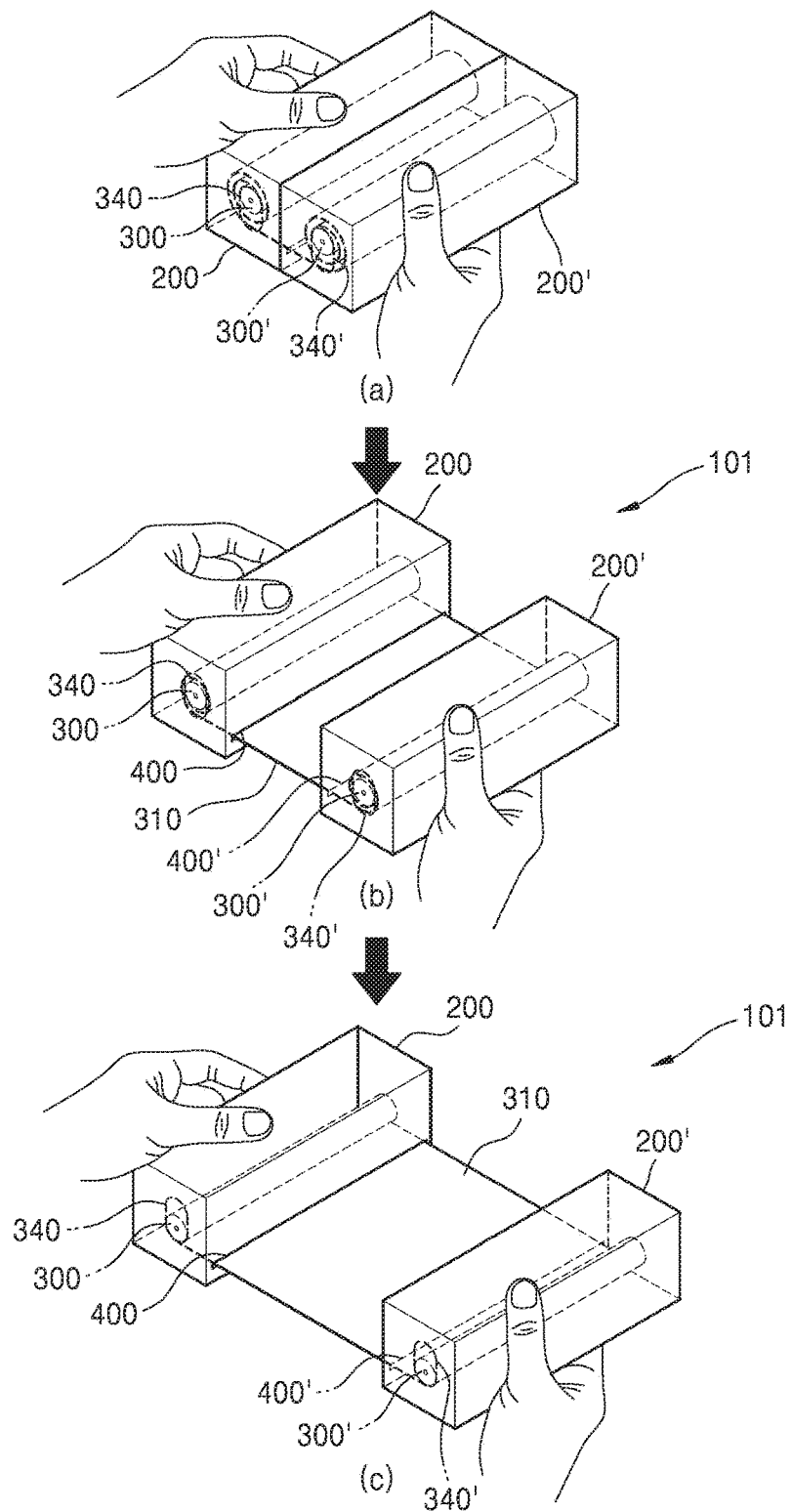

FIG. 20 includes perspective views of the electronic device 101 according to an embodiment. Referring to FIG. 20, the electronic device 101 includes a pair of housings 200 and 200', and rolls 300 and 300' are provided in the housings 200 and 200', respectively. An end of the flexible display 310 is fixed to the roll 300 and the other end thereof is fixed to the roll 300'. The flexible display 310 is wound on the rolls 300 and 300' and accommodated in the housings 200 and 200'. Openings 400 and 400' through which the flexible display 310 enters and exits are provided in the housings 200 and 200', respectively. The housings 200 and 200' are positioned in such a manner that the openings 400 and 400' face each other. Roll guides 340 and 340' for guiding the rolls 300 and 300' are provided in the housings 200 and 200', respectively. Due to the above-described configuration, the flexible display 310 may extend out of/retract into the housings 200 and 200' by pulling/pushing the housings 200 and 200' away from/toward each other.

FIG. 20(*a*) shows that the flexible display 310 is accommodated in the housings 200 and 200'. The housings 200 and 200' closely contact each other. In this state, when the housings 200 and 200' are pulled away from each other, as illustrated in FIG. 20(*b*), the flexible display 310 is unwound from the rolls 300 and 300', extends through the openings 400 and 400', and is spread between the housings 200 and 200'. When the housings 200 and 200' are pulled away from each other by the maximum distance, as illustrated in FIG. 20(*c*), the flexible display 310 is completely unwound from the rolls 300 and 300' and spread between the housings 200 and 200', thereby ensuring the widest image display area.

The roll guides 340 and 340' extend in a vertical direction. The rolls 300 and 300' move downward along the roll guides 340 and 340' as the flexible display 310 is unwound from the rolls 300 and 300', and are positioned at lower ends of the roll guides 340 and 340' when the flexible display 310 is completely spread. When the housings 200 and 200' are pushed toward each other, the rolls 300 and 300' rotate in directions for winding the flexible display 310 thereon due to, for example, elastic force of the spiral spring 1000. When a wound length of the flexible display 310 on the rolls 300 and 300' is increased, the rolls 300 and 300' move upward along the roll guides 340 and 340'. Therefore, even when the wound length of the flexible display 310 on the rolls 300 and 300' varies, proceeding directions of the flexible display 310 with respect to the openings 400 and 400' in the housings 200 and 200' may be constantly maintained.

Each of the above-described elements of the electronic device according to various embodiments may include one or more components, and the names of the elements may vary depending on the type of the electronic device. The electronic device according to various embodiments may include at least one of the above-described elements and may not include some elements or may further include additional elements. Furthermore, some of the elements of the electronic device according to various embodiments may be combined to configure a single entity, and the single entity may equally perform functions of the combined elements.

The invention claimed is:

1. An electronic device comprising:
   a housing having an opening;
   a roll mounted in the housing;
   a flexible display wound on the roll and being extendable and retractable through the opening based on a rotation direction of the roll; and
   a roll guide configured to guide the roll to align a proceeding direction of the flexible display with the opening in the housing, based on a variation in a diameter of wound flexible display on the roll.

2. The electronic device of claim 1, further comprising a central shaft configured as an axis of rotation of the roll, wherein the roll guide guides the central shaft.

3. The electronic device of claim 1, further comprising a winding member configured to provide elastic force upon the roll in a direction capable of winding the flexible display on the roll.

4. The electronic device of claim 3, further comprising a locking unit configured to lock the roll so as to prevent rotation of the roll in a direction of the elastic force of the winding member.

5. The electronic device of claim 4, wherein the locking unit comprises:
   a stopper projection provided on the roll; and
   a stopper lever comprising:
      a release location where interference with the stopper projection is released, and
      a contact location where the stopper lever is obstructed by the stopper projection to stop rotation of the roll.

6. The electronic device of claim 1, wherein the roll guide is configured to guide the roll in a direction perpendicular to the proceeding direction of the flexible display toward the opening in the housing.

7. The electronic device of claim 1, wherein the roll guide is configured to guide the roll diagonally to a direction perpendicular to the proceeding direction of the flexible display toward the opening in the housing.

8. The electronic device of claim 1, further comprising a display guide comprising a supporting surface configured to:
   support the flexible display, and
   guide the flexible display unwound from the roll, toward the opening in the housing.

9. The electronic device of claim 8, further comprising a guide member configured to guide the flexible display at a side opposite to the display guide with respect to the flexible display interposed between the guide member and the display guide.

10. The electronic device of claim 9, wherein the guide member is configured to guide the flexible display in a horizontal direction after passing through the opening in the housing.

11. The electronic device of claim 8, further comprising a push member configured to push the roll toward the display guide such that the flexible display wound on the roll contacts the supporting surface.

12. The electronic device of claim 11, further comprising an elastic member configured to provide elastic force upon the push member to push the push member toward the display guide.

13. The electronic device of claim 11, wherein the push member comprises a roller rotating in contact with the flexible display.

14. The electronic device of claim 8, wherein the push member comprises a roll spring supported by the roll guide and configured to push the roll toward the display guide.

15. The electronic device of claim 1, further comprising:
   a pinion gear rotating together with the roll; and
   a rack gear connected to the pinion gear and extending in an extension direction of the roll guide.

* * * * *